United States Patent
Jeyachandran et al.

(10) Patent No.: US 10,373,611 B2
(45) Date of Patent: Aug. 6, 2019

(54) MODIFICATION OF ELECTRONIC SYSTEM OPERATION BASED ON ACOUSTIC AMBIENCE CLASSIFICATION

(71) Applicant: Gracenote, Inc., Emeryville, CA (US)

(72) Inventors: Suresh Jeyachandran, Alameda, CA (US); Vadim Brenner, San Francisco, CA (US); Markus K. Cremer, Orinda, CA (US)

(73) Assignee: Gracenote, Inc., Emeryville, CA (US)

( * ) Notice: Subject to any disclaimer, the term of this patent is extended or adjusted under 35 U.S.C. 154(b) by 0 days.

(21) Appl. No.: 14/147,366

(22) Filed: Jan. 3, 2014

(65) Prior Publication Data

US 2015/0194151 A1   Jul. 9, 2015

(51) Int. Cl.
*G10L 15/20* (2006.01)
*H03G 3/00* (2006.01)
*G10L 25/48* (2013.01)
*H03G 3/30* (2006.01)
*G10L 15/22* (2006.01)

(52) U.S. Cl.
CPC .............. *G10L 15/20* (2013.01); *G10L 25/48* (2013.01); *H03G 3/002* (2013.01); *H03G 3/3005* (2013.01); *H03G 3/3089* (2013.01); *G10L 2015/225* (2013.01)

(58) Field of Classification Search
CPC ... G10L 15/20; G10L 25/48; G10L 2015/225; H03G 3/3089; H03G 3/3005; H03G 3/002
USPC ........................................................ 704/233
See application file for complete search history.

(56) References Cited

U.S. PATENT DOCUMENTS

| 6,098,040 | A | 8/2000 | Petroni et al. |
| 6,888,457 | B2 | 5/2005 | Wilkinson et al. |
| 7,117,149 | B1* | 10/2006 | Zakarauskas ................. 704/233 |
| 7,333,618 | B2 | 2/2008 | Shuttleworth et al. |
| 7,903,825 | B1 | 3/2011 | Melanson |
| 8,045,726 | B2 | 10/2011 | Kimura |
| 8,607,295 | B2 | 12/2013 | Bhatia et al. |
| 2003/0018475 | A1 | 1/2003 | Basu et al. |
| 2003/0044021 | A1* | 3/2003 | Wilkinson ........... A61B 5/0002 381/56 |

(Continued)

FOREIGN PATENT DOCUMENTS

| AT | 414283 | * | 1/2006 |
| WO | WO-2015102921 A1 | | 7/2015 |

OTHER PUBLICATIONS

Machine translation for AT 414 283, Wolfgang (Year: 2006).*

(Continued)

*Primary Examiner* — Qian Yang
(74) *Attorney, Agent, or Firm* — Hanley, Flight & Zimmerman, LLC (57) ABSTRACT

Methods and systems for modification of electronic system operation based on acoustic ambience classification are presented. In an example method, at least one audio signal present in a physical environment of a user is detected. The at least one audio signal is analyzed to extract at least one audio feature from the audio signal. The audio signal is classified based on the audio feature to produce at least one classification of the audio signal. Operation of an electronic system interacting with the user in the physical environment is modified based on the classification of the audio signal.

18 Claims, 6 Drawing Sheets

(56) References Cited

U.S. PATENT DOCUMENTS

| | | | |
|---|---|---|---|
| 2003/0069727 A1 | 4/2003 | Krasny et al. | |
| 2004/0064315 A1 | 4/2004 | Deisher et al. | |
| 2005/0137861 A1* | 6/2005 | Dideriksen et al. | 704/205 |
| 2005/0175970 A1 | 8/2005 | Dunlap et al. | |
| 2007/0005206 A1 | 1/2007 | Zhang et al. | |
| 2007/0233743 A1 | 10/2007 | Rosenberg | |
| 2008/0103781 A1* | 5/2008 | Wasson | G10L 15/22 704/277 |
| 2008/0190267 A1* | 8/2008 | Rechsteiner | G10H 1/0041 84/609 |
| 2009/0063975 A1* | 3/2009 | Bull | G06F 17/30749 715/716 |
| 2009/0094630 A1* | 4/2009 | Brown | H04H 60/33 725/12 |
| 2009/0172146 A1* | 7/2009 | Bates | G06F 17/30749 709/224 |
| 2009/0248403 A1* | 10/2009 | Kinoshita | H04N 7/147 704/219 |
| 2010/0112991 A1 | 5/2010 | Hannaby | |
| 2010/0114344 A1 | 5/2010 | Hannaby | |
| 2011/0066438 A1* | 3/2011 | Lindahl | G10L 13/033 704/258 |
| 2013/0014136 A1 | 1/2013 | Bhatia et al. | |
| 2013/0166042 A1* | 6/2013 | Sharma | G05B 15/02 700/28 |
| 2013/0211826 A1 | 8/2013 | Mannby | |
| 2013/0243245 A1* | 9/2013 | Bill | G06F 17/30743 382/103 |
| 2013/0282388 A1* | 10/2013 | Engdegard | G10H 1/0008 704/500 |
| 2013/0337889 A1* | 12/2013 | Gagner | G07F 17/3209 463/25 |
| 2014/0288932 A1* | 9/2014 | Yeracaris | G10L 15/30 704/249 |
| 2014/0334644 A1* | 11/2014 | Selig | H03G 5/165 381/108 |
| 2015/0012267 A1* | 1/2015 | Rill et al. | 704/233 |
| 2015/0106404 A1* | 4/2015 | Boulter | G06F 17/30761 707/793 |
| 2015/0147045 A1* | 5/2015 | Birnkrant | G11B 27/031 386/241 |

OTHER PUBLICATIONS

"International Application Serial No. PCT/US2014/071105, International Search Report mailed Mar. 27, 2015", 2 pgs.

"International Application Serial No. PCT/US2014/071105, Written Opinion mailed Mar. 27, 2015", 6 pgs.

"European Application Serial No. 14876688.4, Response filed Feb. 20, 2017 to Communication pursuant to Rules 161(2) and 162 EPC mailed Aug. 12, 2016", 15 pgs.

Foote, Jonathan, "An Overview of Audio Information Retrieval," Institute of Systems Science of the National University of Singapore, Dec. 18, 1997, 18 pages.

European Patent Office, "Communication pursuant to Rules 161(2) and 162 EPC," issued in connection with European Patent Application No. 14876688.4, dated Aug. 12, 2016, 3 pages.

Patent Cooperation Treaty, "International Preliminary Report on Patentability," issued in connection with International Patent Application No. PCT/US2014/071105, dated Jul. 14, 2016, 8 pages.

Shridhar et al., "Text-independent speaker recognition: A review and some new results", Speech Communication, Elsevier Science Publishers, Amsterdam, NL, vol. 1, No. 3-4, Dec. 1, 1982, 11 pages.

Susanne Schotz, "Acoustic Analysis of Adult Speaker Age", Network and Parallel Computing, vol. 4343, Jan. 1, 2007, pp. 88-107, 21 pages.

Bishop et al., "Perception of pitch location within a speaker's range: Fundamental frequency, voice quality and speaker sex", The Journal of the Acoustical Society of America, American Institute of Physics for the Acoustical Society of America, New York, NY, US, vol. 1 · 132, No. 2, Aug. 1, 2012, 13 pages.

Marc Zissman, "Automatic language identification using Gaussian mixture and hidden Markov models", 2002 IEEE International Conference on Acoustics, Speech, and Signal Processing. Proceedings. (ICASSP). Orlando, FL, May 13-17, 2002; [IEEE International Conference on Acoustics, Speech, and Signal Processing (ICASSP)], New York, NY: IEEE, Apr. 27, 1993 (Apr. 27, 1993), 4 pages.

Gouyon et al., "On the Use of Zero-Crossing Rate for an Application of Classification of Percussive Sounds", Proceedings of the Cost G-6 Conference on Digital Audio Effects (DAFX-00), Verona, Italy, Dec. 9, 2000, 7 pages.

Won et al: "Humming control interface for hand-held devices", Computers and Accessibility, ACM, 2 Penn Plaza, Suite 701 New York NY 10121-0701, Oct. 15, 2007, 2 pages.

Adam J. Sporka, "Non-speech Sounds for User Interface Control", Thesis submitted to the Faculty of Electrical Engineering, Czech Technical University in Prague, Apr. 1, 2008, 145 pages.

European Patent Office, "Extended Search Report", issued in connection with European Patent Application No. 14876688.4, dated Aug. 10, 2017, 16 pages.

IP Australia, "Examination Report No. 1 for Standard Patent Application," issued in connection with Australian Application No. 2014374183, dated Jun. 18, 2019, 3 pages.

* cited by examiner

```
        RULES ENGINE
            400

EXAMPLE RULE:
IF
  (SONG_PLAYING_FROM_PLAYLIST) AND
  (USER_SINGING OR USER_HUMMING OR
  USER_TAPPING OR VOLUME_INCREASED)),
THEN
  (INCLUDE_SIMILAR_SONGS_IN_PLAYLIST).
```

MODIFICATION OF ELECTRONIC SYSTEM OPERATION BASED ON ACOUSTIC AMBIENCE CLASSIFICATION

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Copyright 2014, Gracenote, Inc. All Rights Reserved.

TECHNICAL FIELD

This application relates generally to data processing and, more specifically, to systems and methods for the modification of electronic system operation based on acoustic ambience classification.

BACKGROUND

In virtually any physical environment, such as, for example, an automobile, a living room, a bar, or a large arena, one or more sounds may be generated. Such sounds may be generated or produced by weather (e.g., rain, wind, and so on), mechanical devices (e.g., automobile engine noise, appliance operation, and the like), people (e.g., speech, laughter, and so forth), and other sources. Such sounds may thus be indicative of various aspects or characteristics of the physical environment, such as, for example, the general nature of the environment, the number of people present at the environment, the general mood of the people present, and so on.

Such sounds may also directly impact the operation of one or more computing or processing systems operating in, or associated with, the environment. For example, adverse weather and other sources of background sounds or noise may adversely affect the operation of an automated speech recognition system being utilized by a user at the environment.

BRIEF DESCRIPTION OF THE DRAWINGS

Some embodiments are illustrated by way of example and not limitation in the figures of the accompanying drawings in which.

DETAILED DESCRIPTION

In the following description, for purposes of explanation, numerous specific details are set forth in order to provide a thorough understanding of example embodiments. It will be evident, however, to one skilled in the art that the present subject matter may be practiced without these specific details.

Figure 1:
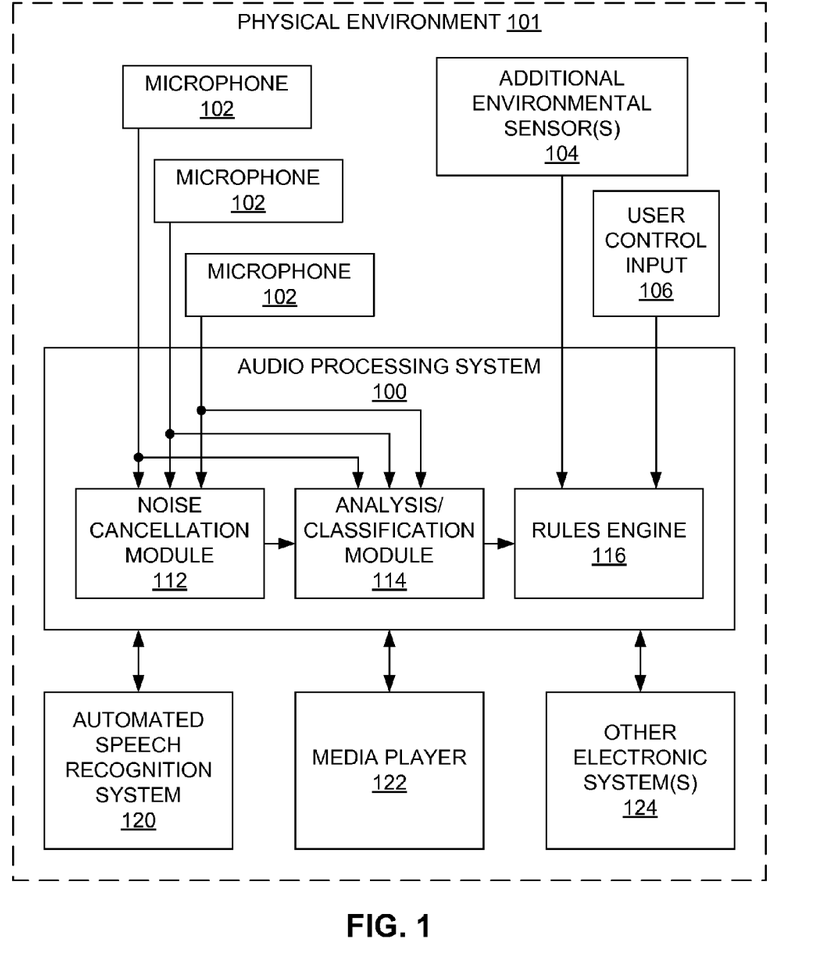
FIG. 1 is a block diagram illustrating an example audio processing system operating in relation to a physical environment of a user.

FIG. 1 illustrates an example audio processing system 100 operating in relation to a physical environment 101. Examples of the physical environment 101 may include, but are not limited to, the interior of an automobile passenger compartment; a room of a particular house, apartment, office building, or other structure; a stadium or arena; or any other physical location, regardless of size, in which one or more people may be located. In at least some of the embodiments described in greater detail below, the physical environment 101 may be any environment in which one or more sounds or audio signals may be detected, even if the source of one or more of the sounds lies external to the physical environment 101.

As shown in FIG. 1, the audio processing system 100 may be coupled with one or more microphones 102 for detecting the sounds or audio signals present in the physical environment 101. While three microphones 102 are displayed in FIG. 1, any number of microphones 102 may be employed in the physical environment 101 in the various implementations described more fully below. In some embodiments, multiple microphones 102 may serve collectively as a microphone array, in which the locations of the microphones 102 are distributed within the physical environment 101. Such a distribution may provide more sensitive detection of sounds within the physical environment 101. Moreover, in some implementations, the use of a microphone array may also allow the more accurate positional or directional locating of the sources of sounds within the physical environment 101. The detected audio signals are provided to the audio processing system 100 for processing, as discussed below. For example, the audio processing system 100 may employ audio signals from multiple microphones 102 to spatially locate the source of individual sounds, and this location information may influence the audio processing system 100 in processing those sounds such as to distinguish between various people (e.g., in an automotive environment, the voice characteristics of the driver versus one or more passengers, or, in a living room, the voice profile of a person holding the remote control versus others present). In other implementations, the audio processing system 100 may process the audio signals from multiple microphones 102 to identify noises originating from outside the physical environment 101, such as street noise (in the case of an automobile) or noise coming from a different room (in the case of a living room).

In some embodiments, at least one optional additional environmental sensor 104 may be employed to detect non-audio characteristics of the physical environment 101, including actions of people or users located in the physical environment 101. The environmental sensors 104 may include, for example, touch or contact sensors, vibration sensors, inertial sensors, three-dimensional (3D) sensors, eye tracking sensors, gaze interaction sensors, and so on. In the example of an automobile interior, touch or vibration sensors may be coupled with surfaces that the driver or another occupant may contact, such as the steering wheel, the gear shift, the seats, the armrests, and the like. In response to the contacts, vibrations, or other sensations imparted on the environmental sensors 104, the environmental sensors 104 may provide signals corresponding to those sensations to the audio processing system 100.

In addition, the audio processing system 100 may receive additional information from one or more electronic systems within and/or external to the physical environment 101 to further characterize the received audio signals. For example, the audio processing system 100 may receive location information regarding the location of the physical environment 101 (e.g., a moving automobile) to determine that the automobile is in a tunnel or next to an airport, thus possibly allowing interpretation of some audio signals as echoed car noise, aircraft noise, and so on. In another example, the audio processing system 100 may receive speed information indicating the automobile is travelling at a high rate of speed, thus possibly interpreting some background noise as wind noise, tire noise, engine noise, and so forth. In some implementations, the audio processing system 100 may receive local weather condition information, thus possibly interpreting certain audio signals received as wind noise, rain noise, thunder, and the like in the event of inclement weather.

Further, user control input 106 provided by a user located in the physical environment 101 to a system operating in relation to the physical environment 101 may be forwarded to the audio processing system 100 to supply further context regarding user actions within the physical environment 101. For example, in the automobile context, a user may increase or lower the volume of the car radio, decelerate or accelerate the vehicle, and so on. Some representation of these actions, such as an electronic signal or message, may also be forwarded to the audio processing system 100.

As is described in greater detail below, the audio processing system 100 may employ the information received via the one or more microphones 102, possibly along with any additional environmental sensors 104 and user control input 106, to modify the operation of an electronic system interacting with the user in the physical environment 101. Examples of such an electronic system may include, but are not limited to, an automated speech recognition system 120, a media player 122 (e.g., an audio player, an audio/video player, a set-top box, a content streaming device, a television or other display device, and so on), a Global Positioning System (GPS) navigation device, a gaming device, a general-purpose computer (e.g., a desktop computer, laptop computer, or tablet computer), a mobile communication device (e.g., a smart phone or personal digital assistant (PDA)), or other electronic system 124. In at least some examples, the audio processing system 100 may modify the operation of the one or more electronic systems 120, 122, and 124 by interpreting the sounds, or "acoustic ambience," of the physical environment 101, possibly along with other human inputs, to modify the operation of the one or more electronic systems 120, 122, and 124 according to that interpretation. Consequently, such modifications may improve the operation of the one or more electronic systems 120, 122, and 124 for the benefit of one or more users located at the physical environment 101.

While the audio processing system 100 and other systems or devices of FIG. 1 are shown as being located within the physical environment 101 in which the sounds, other environment effects, and user control input 106 are detected, other embodiments may not be limited in such a manner. For example, any or all of the audio processing system 100, the automated speech recognition system 120, the media player 122, and other electronic systems 124 may be located outside the physical environment 101 in at least some implementations. Further, a system located outside the physical environment 101 may be communicatively coupled with other components or systems located at the physical environment 101 by way of a communication network. The communication network may be, for example, a Wide-Area Network (WAN), such as the Internet, a Local-Area Network (LAN), a cellular telephone network, a Wi-Fi™ network, a Bluetooth® connection, or the like.

Also, while each of the systems and components of FIG. 1 are shown separately, other embodiments may physically combine two or more of the systems and/or components shown in FIG. 1 in other implementations. For example, the audio processing system 100 may be incorporated within the particular electronic system of interest (e.g., the automated speech recognition system 120, the media player 122, or another electronic system 124). Oppositely, one or more of the systems or components depicted in FIG. 1 as single units may be separated to yield multiple components or devices.

As depicted in FIG. 1, the audio processing system 100 may include an optional noise cancellation module 112, an analysis/classification module 114, and a rules engine 116. Other components or modules may also be included in the audio processing system 100, but are not illustrated in FIG. 1 to simplify and focus the following discussion. Further, each of the noise cancellation module 112, the analysis/classification module 114, and the rules engine 116 may be implemented as hardware, software, or some combination thereof.

The noise cancellation module 112, if employed in the audio processing system 100, may reduce or eliminate noise or other unwanted or unnecessary audio signals or sounds detected via the microphones 102. At least some of these filtered sounds may be sounds that mask other more worthwhile sounds that may be processed by the audio processing system 100. One example of such a sound may be engine noise of an automobile. In other examples, at least some of the filtered sounds may be sounds of which the audio processing system 100 is aware, such as a song or other audio that is being played at the physical environment 101. In at least some examples, the noise cancellation module 112 may be optional, thus allowing the analysis/classification module 114 to receive the audio signals directly without noise cancellation.

The analysis/classification module 114 may analyze the received audio signals or sounds to identify or classify the sounds, such as a user singing, a user humming, a user tapping or drumming on a surface, wind noise, rain noise, fan noise, competing sources of music or other content, ongoing conversation, unwanted reverberation, and so on. In some examples, the analysis/classification module 114 may classify not only a type of activity in which the user is engaging, but may also determine one or more of a gender, age, state of mind, and/or mood of a user.

The analysis/classification module 114, as mentioned above, may receive audio signals for which noise has been removed or reduced by the noise cancellation module 112, or may receive the audio signals directly from the one or more microphones 102. In other implementations, the analysis/classification module 114 may have direct access to audio signals both directly from the one or more microphones 102 and the noise cancellation module 112. For example, the analysis/classification module 114 may use the direct microphone audio signals for some classes of noise, and the audio signals from the noise cancellation module 112 for other classes of noise. Such implementations may enable proper assessment of the noise level for noise-based or noise-influenced classifications (e.g., a level of wind noise in an automobile passenger compartment) while taking advantage of the noise cancellation available for other sound components (e.g., speaker gender identification). A more detailed discussion of the analysis/classification module 114 is provided below in conjunction with FIG. 2.

The rules engine 116 may receive the sound classifications generated by the analysis/classification module 114, possibly along with information from the additional environmental sensors 104 and/or the user control input 106, and generate commands, instructions, or messages to modify the operation of an electronic system, such as, for example, the automated speech recognition system 120 or the media player 122 based on the received classifications and, if present, other information. In one example, the rules engine 116 may interpret a user humming or singing along with a song that is currently playing via the media player 122 (e.g., a car radio) in the physical environment 101 (e.g., an automobile passenger compartment) as the user liking the song. In response, the rules engine 116 may alter the operation of the media player 122, such as, for example, altering a playlist of the media player 122 to include similar songs, or songs performed by the same musical group. Other examples of the operation of the rules engine 116 are discussed hereinafter.

Figure 2:
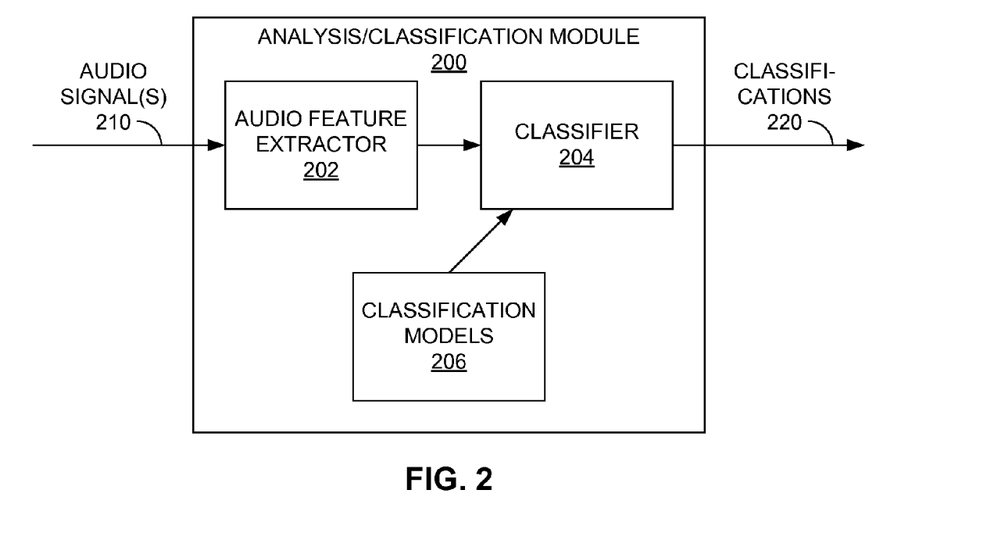
FIG. 2 is a block diagram illustrating an example analysis/classification module employable in the audio processing system of FIG. 1.

FIG. 2 is a block diagram illustrating an example analysis/classification module 200 employable as the analysis/classification module 114 in the audio processing system 100 of FIG. 1. As depicted in FIG. 2, the analysis/classification module 200 may include an audio feature extractor 202, classification models 206, and a classifier 204. The analysis/classification module 200 may include other components or modules, but such components are not depicted in FIG. 2 to focus the following discussion.

The audio feature extractor 202 may extract one or more audio features from the at least one audio signal 210. Generally, an audio feature is a measurable characteristic of a segment of audio, such as over a defined time interval. Example audio features may include, but are not limited to, volume, pitch, energy, bandwidth, zero crossing rate (ZCR), spectral envelope, tilt, sharpness, centroid, mel-frequency cepstral coefficients (MFCCs), and so on. In some implementations, the audio feature extractor 202 extracts the features over each predefined or fixed interval from each of the one or more received audio signals (e.g. from the microphones 102 or the noise cancellation module 112). In some examples, the predefined interval may be 100 milliseconds (msec), but other intervals may be employed in other embodiments of the audio feature extractor 202.

The classifier 204 may receive the audio features of the at least one audio signal 210 as they are extracted by the audio feature extractor 202. Based on these extracted audio features, in conjunction with a set of predetermined or pre-trained classification models 206, the classifier 204 may produce one or more classifications 220 for the at least one audio signal 210. In one example, the classifications are descriptions or identifications of the sounds embodied in the at least one or more audio signals 210 being classified. Accordingly, each of the classification models 206 may relate one or more audio features to at least one classification 220. Such relationships may be stored as classification models by way of a relational database, a look-up table, or other data structure. Also, the classifier 204 may be configured according to any of a number of classifier types, including, but not limited to, a Gaussian mixture model (GMM), a support vector machine (SVM), a neural network, non-negative matrix factorization (NNMF), hidden Markov models (HMMs), and so on.

In other implementations, the classifier 204 may also be configured to identify specific songs being played, such as by way of audio "fingerprinting". Based on the fingerprinting, the audio processing system 100 may treat the particular song being played as ambient noise and filter or otherwise remove the effects of the song (e.g., by way of controlling the noise cancellation module 112 or another module within the audio processing system 100) from other audio signals to improve recognition or processing of those other signals.

Figure 3:
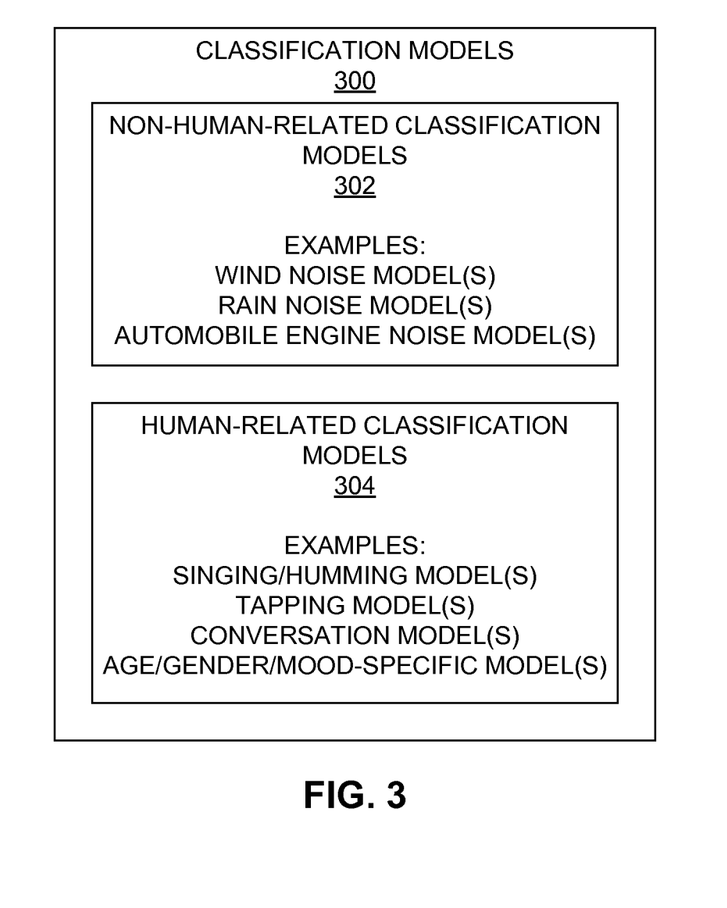
FIG. 3 is a block diagram illustrating example classification models employable in the analysis/classification module of FIG. 2.

FIG. 3 is a block diagram illustrating example classification models 300 employable as the classification models 206 of the analysis/classification module 200 of FIG. 2. As shown, the classification models 300 may include, for example, non-human-related classification models 302 and human-related classification models 304, although the various classification models 300 may not be organized in such a manner. The non-human-related classification models 302 may include models for noises that are not directly sourced or caused by a human. Such models may include, but are not limited to, wind noise models, rain noise models, automobile engine noise models, tire noise models, traffic noise models, and the like. The human-related classification models 304 may include models for noises that are more directly caused or sourced by a human. As shown in FIG. 3, the human-related classification models 304 may include models for singing, humming, tapping (e.g., on a steering wheel or other surface), conversing, a door opening or closing, footsteps, and so on. Further, some of the vocally-oriented (e.g., singing, humming, talking) models may further be classified into particular ages or age groups, genders, or even moods or states of mind, based on the audio characteristics or features normally associated with each classification.

In some implementations, the classification models 300 may be improved or retrained as the audio processing system 100 is used over time. For example, if the user provides input to the audio processing system 100 as to the identity and/or other characteristics (e.g., age and gender) of various individuals commonly located in the physical environment 101, at least some of the classification models 300 may be adjusted to identify those particular individuals. These adjustments may result in classification models 300 being developed specifically for one or more individuals. Such classification models 300 may include, for example, "John Smith singing," "John Smith laughing," and so on. These types of classification models 300 may be further enhanced by the audio processing system 100 requesting the individual to provide audio samples of their voices while performing such activities.

Accordingly, the rules engine 116 (FIG. 1) may receive the classifications 220 generated by the classifier 204 of the analysis/classification module 114, 200 and, based on those classifications 220, adjust the operation of an electronic system (e.g., the automated speech recognition system 120, the media player 122, or another electronic system 124). As shown in FIG. 1, the rules engine 116 may also receive input from the additional environmental sensors 104 (e.g., touch sensors, activation sensors, and so forth) and user control input 106 (e.g., volume or tuning adjustment of the media player 122 by the user) to aid in determining the adjustment to be made to the electronic system based on the particular rules employed in the rules engine 116.

Figure 4:
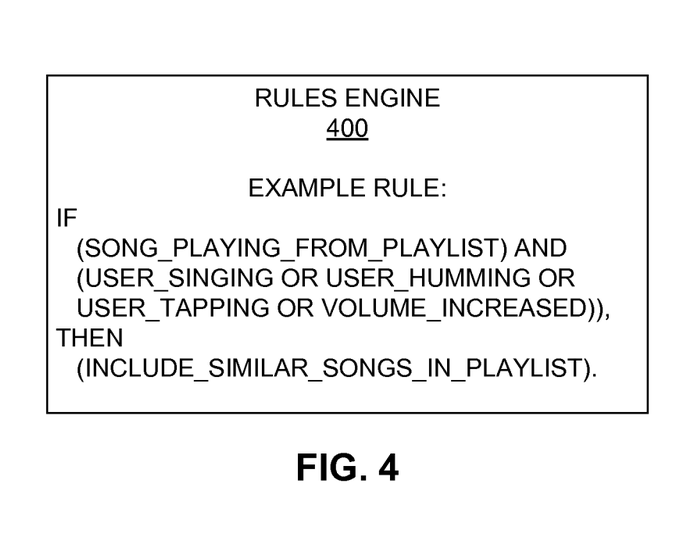
FIG. 4 is a block diagram illustrating an example rules engine employable in the audio processing system of FIG. 1.

FIG. 4 is a block diagram illustrating an example rules engine 400 employable as the rules engine 116 in the audio processing system 100 of FIG. 1. An example rule, as expressed in FIG. 4 pseudo-language, may be "if (song_playing_from_playlist) and (user_singing or user_humming or user_tapping or volume_increased)), then (include_similar_songs_in_playlist)." In this particular example, each of the conditions may be one of an audio classification 220 generated by the analysis classification module 114, 200 (e.g., user_singing, user_humming), information from an additional environmental sensor 104 (e.g., user_tapping), or a user control input 106 (e.g., volume_increased). Also in this example, the rules engine 116 may employ other inputs, such as a current operational state of the electronic system to be adjusted or modified (e.g., song_playing_from_playlist, relating to the media player 122) to determine whether and, if so, how the operation of the electronic system (e.g., the media player 122) should be modified. In this case, the playlist of the media player 122 may be modified to include other songs similar to the one currently playing, as the user is exhibiting at least some characteristics of a person who is enjoying that song.

As mentioned above, the operation of any type of computing device that is operating in relation to the physical environment 101 may be modified using the audio processing system 100 described above. In the case of the electronic system being a media player 122, one or more of several different aspects of the operation of the media player 122 (e.g., a particular channel, program, or song to be played, a volume level of the content, and so on) may be modified according to the embodiments discussed herein. For example, if the media player 122 is an audio player operating within an automobile, the audio processing system 100 may determine via the sounds detected via microphones 102 positioned within the passenger compartment that one or more sources of noise (e.g., wind, rain, engine, tires, etc.) that constitute the acoustic ambience of the automobile may merit an increase in the volume of the current song being played. Oppositely, a decrease in noise may result in a decrease in the song volume. However, if the audio processing system 100 detects a conversation between two or more parties within the vehicle, the audio processing system 100 may decrease the volume of the content being played, interpreting such a conversation as a lack of interest by the parties in the current media content. Oppositely, if the audio processing system 100 determines that the occupants of the vehicle are singing or humming, the audio processing system 100 may instead increase the volume. In addition, the audio processing system 100 may receive and process other sensor or user input, such as a rhythmic tapping on the steering wheel, or a user-controlled repeat play of the current song, to determine that the volume may be increased.

In addition to controlling the volume, the audio processing system 100 may alter a playlist or select a different channel of media content based on the audible or other sensed reactions of the automobile driver and/or passengers, as well as on the control exerted on the media player 122 by any of these parties. For example, the audio processing system 100 may interpret singing, humming, or tapping by the users, or an increase in volume of the media player 122 caused by one of the users, as heightened interest in the current song. In response, the audio processing system 100 may alter a playlist of the media player 122 to include more songs of that same genre, or more songs from the same musical group, as the currently playing song. On the other hand, signs of disapproval by the parties, either vocally or by a user-controlled reduction in volume or skipping of the current song, may influence the audio processing system 100 to remove that song from the playlist, change a particular media content channel being listened to, skip the current song, or the like. Similarly, such detected signs of approval or disapproval may cause the audio processing system 100 to provide like/dislike input, thumbs up/thumbs down input, skip current song input, and other types of feedback or input to an adaptive radio service or other types of audio sources.

In some implementations, the audio processing system 100 may influence music selections in response to detecting one or more types of background noise or sounds within the physical environment 101, such as, for example, rain noise, wind noise, and the like. For example, the detection of rain noise may prompt the audio processing system 100 to play songs that portray a calm or reflective mood, or that reflect a theme involving rain.

In another example, if the audio processing system 100 determines that the users are engaged in a discussion, the audio processing system 100 may select a media item more appropriate for such an environment, such as, for example, a more calming instrumental music selection to be played. In yet other implementations, if the occupants are detected as speaking in a particular language, the audio processing system 100 may select songs that are recorded in the same language, or that originate from an area of the world identified with that language. In some scenarios, if the audio processing system 100 detects the presence of children's voices in the passenger compartment, the audio processing system 100 may ensure that the music being played by the media player 122 is age-appropriate (e.g., songs with non-explicit lyrics, songs addressing children's themes, and the like) for those children by way of rating information associated with the music. Further, based on the presence of both children and adults in the car, the audio processing system 100 may generate song selections that represent a family-friendly compromise. In other examples, the audio processing system 100 may attempt to address detected negative moods of the passengers (e.g., sleepy, upset, or disgruntled) by playing music selections that alleviate those moods. For example, the audio processing system 100 may decide to play lullabies to soothe a crying infant, and then possibly transition to other music once the audio processing system 100 detects that the infant is calm or has fallen asleep.

In some embodiments, if the audio processing system 100 detects sounds or noises that originate either within or external to the physical environment 101 (e.g., an automobile) that indicate a need for immediate user attention (e.g., the generated voice of a GPS navigation system, the ringing of a phone, or the sound of an emergency vehicle siren), the audio processing system 100 may lower the volume of the currently play song, or pause the currently playing song. The audio processing system 100 may then resume the original volume or the playing of the song at some point after the detected sound or noise ceases or falls in volume below some defined threshold. In such examples, the audio processing system 100 may not infer any particular level of interest or disinterest in the currently playing song on behalf of the user.

While the examples described above are related to the automobile environment, similar implementations may be employed within the home or another interior space in conjunction with any media player 122, including, but not limited to, a radio or other audio player, a smart phone, a desktop computer, a laptop computer, a tablet computer, a gaming system, or a television. For example, the audio processing system 100 may be configured to receive audio signals from microphones 102 within a room in which a television is playing a particular program. If the audio processing system 100 interprets the detected sounds as laughter, applause, cheering, booing, or some other type of indication of strong user engagement with the program, the audio processing system 100 may modify the operation of the television, or a set-top box coupled thereto, in a number of ways, including, but not limited to, increasing a volume of the television, recording the current program for later viewing, and recording (or setting viewing reminders for) future episodes of the same program, and possibly other programs similar to the program currently being viewed. As with other examples discussed above, the audio processing system 100 may consider additional information from environmental sensors 104 and user control input 106 applied to the television or set-top box to determine how the operation of the television or set-top box may be modified.

Conversely, if the audio processing system 100 determines that viewers of the program may be ignoring the program (e.g., conversation occurring between viewers, footsteps and door noises indicating viewers leaving the room, and so on), the audio processing system 100 may perform any number of operations to deemphasize the program, including, but not limited to, lowering the volume, changing the television channel, and cancelling future recordings of the program. In other examples, if the audio processing system 100 determines that children are present, the audio processing system 100 may select more family-friendly programs, or may remove portions of a program that may be inappropriate for those children. The audio processing system 100 in this example may also employ any of the techniques identified above in conjunction with a media player 122 located in an automobile to modify or select appropriate audio or audio/video programming.

In another example, the electronic system of interest may be an automated speech recognition system 120 (FIG. 1). In one implementation, the microphone 102 of the audio processing system 100 may be the same microphone 102 used by the user of the automated speech recognition system 120 to provide the spoken words to be recognized. In this example, the audio processing system 100 may alter the operation of the automated speech recognition system 120 by, for example, adjusting the automated speech recognition system 120 in response to the given acoustic ambience of the physical environment 101 (for example, an office, an automobile, an airport terminal, and so on). For example, if certain types of noise (e.g., wind noise, rain noise, background voices) detected within the physical environment 101 are disrupting (or are likely to disrupt) the ability of the automated speech recognition system 120 to recognize the spoken words of the user, the audio processing system 100 may command the automated speech recognition system 120 to preprocess the speech sounds of the user to effectively reduce or negate the effect of the acoustic ambience of the physical environment 101. For example, the audio processing system 100 may cause the automated speech recognition system 120 to utilize a noise suppression algorithm configured to mask the ambient sounds being experienced in the physical environment 101, to regulate more closely one or more of the microphones 102, to limit the frequency range of the incoming audio signals, and/or to segment semantic entities (e.g., words and sentences) by a defined noise level instead of silence.

In some implementations, the audio processing system 100 may adjust the speech recognition engine or module of the automated speech recognition system 120 to increase recognition performance. For example, the audio processing system 100 may cause the automated speech recognition system 120 to reduce or limit the internal vocabulary being employed by the automated speech recognition system 120 to a more essential subset of words and/or phrases so that the probability of incorrectly interpreting the user may be significantly reduced.

Moreover, the audio processing system 100 may inform the user, or command the automated speech recognition system 120 to inform the user that ambient noise is negatively affecting the speech recognition function, and that the system may operate more efficiently if the user responded with one or more actions. Such actions may include, but are not limited to, using a simpler, more limited vocabulary when speaking; changing locations, assuming the automated speech recognition system 120 is portable; speaking louder; and positioning the microphone closer to the user.

Figure 5:
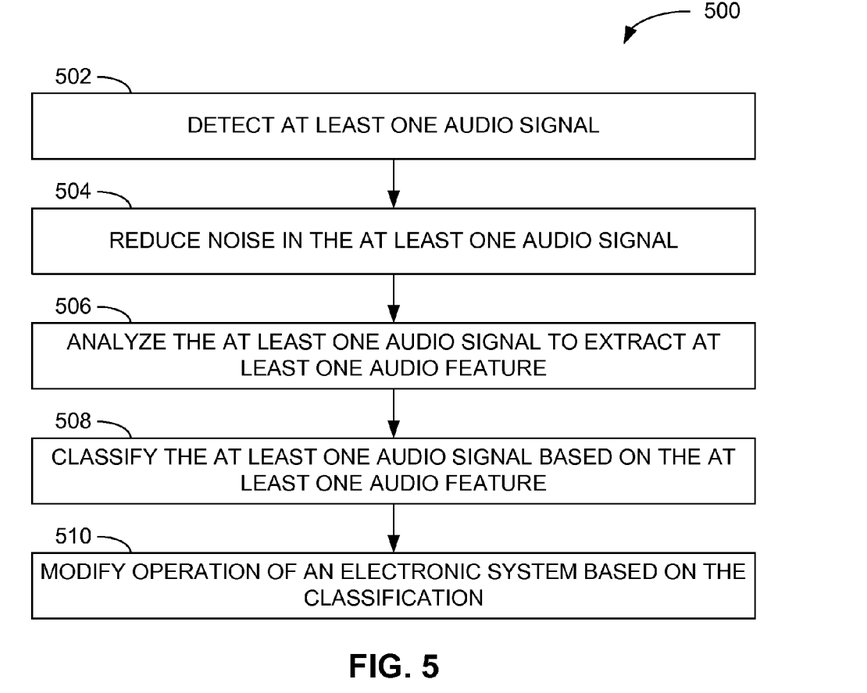
FIG. 5 is a flow diagram illustrating an example method of modifying the operation of an electronic system based on acoustic ambience classification.

FIG. 5 is a flow diagram illustrating an example method 500 of modifying the operation of an electronic system based on acoustic ambience classification. In at least some embodiments, the electronic system interacts with the user within a particular physical environment. In the method 500, at least one audio signal may be detected (operation 502) within the physical environment, such as by way of one or more microphones. In some implementations, noise in the at least one audio signal may be reduced (operation 504), such as by way of a noise reduction or cancellation module that filters or otherwise processes the at least one audio signal to remove unwanted audio components therefrom. The at least one audio signal may be analyzed to extract at least one audio feature from the at least one audio signal (operation 506). In some examples, the audio features may include volume, bandwidth, zero crossing rates, and/or others. The at least one audio signal may be classified based on the at least one audio feature (operation 508). Such classifications may include classification of both human-made sounds (e.g., singing, humming, laughing, talking, tapping on a surface, and so forth), and non-human-made sounds (e.g., wind noise, rain noise, engine noise, and the like). The operation of an electronic system may then be modified based on the classifications (operation 510). In some examples, the modification may be influenced by other types of information, such as from additional environmental sensors, as well as user input provided to the electronic system of interest and/or other systems. Any and all of the various embodiments and options described above with respect to the audio processing system 100 of FIG. 1 may be implemented within the method 500 in other examples.

While the operations 502-510 of method 500 are shown in FIG. 5 as being performed in a particular order, other potential orders of operation, including concurrent or overlapping execution of the operations 502-510, may also be possible. For example, components or modules executing the operations 502-510 may form an execution pipeline, in which each component or module operates on a particular fixed or programmable time segment of the audio signals, then passing the results of that operation onto the next component or module while operating on audio signal data associated with the next time segment.

While specific methods, tasks, operations, and data described herein are associated above with specific systems, other embodiments in which alternative apportionment of such tasks and data among the various systems are also possible.

Also, while much of the preceding discussion is focused on the use of an audio processing system and associated methods within an automobile passenger compartment and a living room, other operating environments, such as a commercial establishment (e.g., a restaurant or bar), a large indoor arena, or an outdoor setting of any type or size, may benefit from application of the various operations and principles discussed herein.

In view of at least some of the embodiments described herein, the operation of an electronic system, such as a media player or output device, automated speech recognition system, navigation system, gaming device, computer, smart phone, and/or so on, may be modified based on the acoustic ambience of the physical environment to which the operation of the electronic system is related. Depending on the particular operations involved, the modifications may combat detrimental effects of the acoustic ambience of the physical environment on the operations, and/or may interpret audible actions, and possible other detectable actions, of one or more users within the physical environment to provide a more effective interaction of the users with the electronic system automatically.

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired) or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., APIs).

Example embodiments may be implemented in digital electronic circuitry, or in computer hardware, firmware, or software, or in combinations thereof. Example embodiments may be implemented using a computer program product (e.g., a computer program tangibly embodied in an information carrier in a machine-readable medium) for execution by, or to control the operation of, data processing apparatus (e.g., a programmable processor, a computer, or multiple computers).

A computer program can be written in any form of programming language, including compiled or interpreted languages, and it can be deployed in any form, including as a stand-alone program or as a module, subroutine, or other unit suitable for use in a computing environment. A computer program can be deployed to be executed on one computer or on multiple computers at one site or distributed across multiple sites and interconnected by a communications network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., a field-programmable gate array (FPGA) or an application-specific integrated circuit (ASIC)).

The computing system can include clients and servers. A client and server are generally remote from each other and typically interact through a communication network. The relationship of client and server arises by virtue of computer programs running on their respective computers and having a client-server relationship to each other. In embodiments deploying a programmable computing system, it will be appreciated that both hardware and software architectures may be considered. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware may be a design choice. Below are set forth hardware (e.g., machine) and software architectures that may be deployed in various example embodiments.

Figure 6:
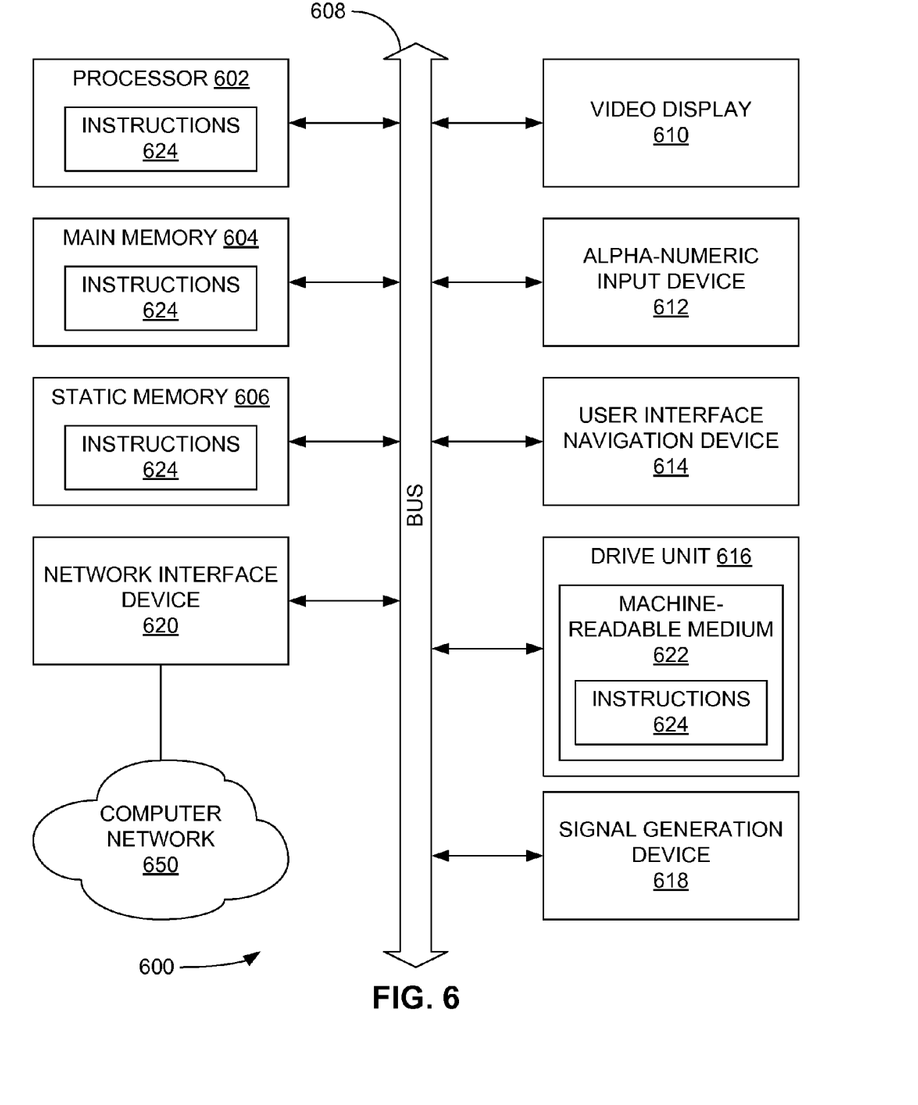
FIG. 6 is a diagrammatic representation of a machine in the example form of a computer system within which a set of instructions for causing the machine to perform any one or more of the methodologies discussed herein may be executed.

FIG. 6 is a block diagram of a machine in the example form of a computer system 600 within which instructions for causing the machine to perform any one or more of the methodologies discussed herein may be executed. In alternative embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 600 includes a processor 602 (e.g., a central processing unit (CPU), a graphics processing unit (GPU), or both), a main memory 604, and a static memory 606, which communicate with each other via a bus 608. The computer system 600 may further include a video display unit 610 (e.g., a liquid crystal display (LCD) or a cathode ray tube (CRT)). The computer system 600 also includes an alphanumeric input device 612 (e.g., a keyboard), a user interface (UI) navigation device 614 (e.g., a mouse), a disk drive unit 616, a signal generation device 618 (e.g., a speaker), and a network interface device 620.

The disk drive unit 616 includes a machine-readable medium 622 on which is stored one or more sets of data structures and instructions 624 (e.g., software) embodying or utilized by any one or more of the methodologies or functions described herein. The instructions 624 may also reside, completely or at least partially, within the main memory 604 and/or within the processor 602 during execution thereof by the computer system 600, the main memory 604 and the processor 602 also constituting machine-readable media.

While the machine-readable medium 622 is shown in an example embodiment to be a single medium, the term "machine-readable medium" may include a single medium or multiple media (e.g., a centralized or distributed database, and/or associated caches and servers) that store the one or more instructions 624 or data structures. The term "non-transitory machine-readable medium" shall also be taken to include any tangible medium that is capable of storing, encoding, or carrying instructions for execution by the machine and that cause the machine to perform any one or more of the methodologies of the present subject matter, or that is capable of storing, encoding, or carrying data structures utilized by or associated with such instructions. The term "non-transitory machine-readable medium" shall accordingly be taken to include, but not be limited to, solid-state memories, and optical and magnetic media. Specific examples of non-transitory machine-readable media include, but are not limited to, non-volatile memory, including by way of example, semiconductor memory devices (e.g., Erasable Programmable Read-Only Memory (EPROM), Electrically Erasable Programmable Read-Only Memory (EEPROM), and flash memory devices), magnetic disks such as internal hard disks and removable disks, magneto-optical disks, and CD-ROM and DVD-ROM disks.

The instructions 624 may further be transmitted or received over a computer network 650 using a transmission medium. The instructions 624 may be transmitted using the network interface device 620 and any one of a number of well-known transfer protocols (e.g., HTTP). Examples of communication networks include a local area network (LAN), a wide area network (WAN), the Internet, mobile telephone networks, Plain Old Telephone Service (POTS) networks, and wireless data networks (e.g., WiFi, LTE, and WiMAX networks). The term "transmission medium" shall be taken to include any intangible medium that is capable of storing, encoding, or carrying instructions for execution by the machine, and includes digital or analog communications signals or other intangible media to facilitate communication of such software.

Although the present subject matter has been described with reference to specific example embodiments, it will be evident that various modifications and changes may be made to these embodiments without departing from the broader scope of the subject matter. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim are still deemed to fall within the scope of that claim. Moreover, in the following claims, the terms "first," "second," "third," and so forth are used merely as labels and are not intended to impose numerical requirements on their objects.

The Abstract of the Disclosure is provided to comply with 37 C.F.R. §1.72(b), requiring an abstract that will allow the reader to quickly ascertain the nature of the technical disclosure. The Abstract is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method, comprising:
   detecting, using a microphone, at least one audio signal present in a physical environment while a media player is playing a song having a genre, the at least one audio signal including first audio data corresponding to the song, second audio data associated with a person exposed to the song, and third audio data associated with noise in the physical environment different than the first audio data and the second audio data;
   cancelling, using the least one hardware processor, the third audio data from the at least one audio signal to generate at least one filtered audio signal;
   analyzing the at least one filtered audio signal to extract at least one audio feature from the at least one audio signal;
   classifying, by at least one hardware processor, the at least one filtered audio signal based on the at least one audio feature to produce a classification of the at least one filtered audio signal, the classification including a reaction of the person to the media content being played by the media player; and
   based on the genre and the reaction, automatically modifying, using the least one hardware processor, operation of the media player by modifying a playlist of media content played by the media player to include more songs of the genre.

2. The method of claim 1, wherein the modifying of the operation of the media player includes adjusting an audio volume produced by the media player.

3. The method of claim 1, wherein the modifying of the operation of the media player includes providing, to the person via an automated speech recognition system, guidance regarding interaction of the person with the automated speech recognition system.

4. The method of claim 1, wherein the classifying includes classifying a gender of the person.

5. The method of claim 1, wherein the classifying includes classifying a language spoken by the person.

6. The method of claim 1, wherein the classifying of the reaction includes detecting contact with a physical surface located in the physical environment.

7. The method of claim 1, wherein the song being played by the media player is by a musical group; and the modifying of the operation of the media player includes altering the playlist of media content played by the media player to include more songs by the musical group.

8. The method of claim 1, wherein the classifying of the at least one filtered audio signal includes classifying the at least one filtered audio signal as including a conversation, and the modifying of the operation of the media player in the physical environment based on the reaction includes reducing a volume of media played by the media player.

9. The method of claim 1, wherein the classifying of the at least one filtered audio signal includes classifying a mood of the person as a negative mood, and the modifying of the operation of the media player includes adding songs to the playlist of media content played by the media player, the added songs selected to alleviate the negative mood.

10. The method of claim 1, wherein the modifying of the operation of the media player based on the reaction and the genre is further based on rating information associated with a second song having non-explicit lyrics and includes adding the second song to the playlist of media content played by the media player.

11. The method of claim 1, wherein the classification includes a detection of children's voices; the modifying of the operation of the media player is further based on the detection of the children's voices and rating information associated with a second song;
   and the modifying of the operation of the media player includes adding the second song to the playlist of media content played by the media player.

12. The method of claim 1, wherein the classifying of the reaction to the media content includes detecting humming by the person.

13. The method of claim 1, wherein the classifying of the reaction to the media content includes detecting tapping by the person.

14. The method of claim 1, wherein the classifying of the reaction to the media content includes detecting drumming by the person.

15. The method of claim 1, further including:
   determining that the third audio data is likely to disrupt an automated speech recognition system, and wherein the modifying of the operation of the media player is further based on the determination that the third audio data is likely to disrupt the speech recognition system and includes reducing a vocabulary of the automated speech recognition system to a subset of available words.

16. The method of claim 1, wherein the microphone includes a first microphone and a second microphone and further including the identifying the third audio data as detected by the second microphone.

17. A non-transitory computer-readable storage medium comprising instructions that, when executed by at least one processor of a machine, cause the machine to perform operations including:
- detecting at least one audio signal present in a physical environment while a media player is playing a song having a genre, the at least one audio signal including first audio data corresponding to the song, second audio data associated with a person exposed to the song, and third audio data associated with noise in the physical environment different than the first audio data and the second audio data;
- cancelling the third audio data from the at least one audio signal to generate at least one filtered audio signal;
- analyzing the at least one filtered audio signal to extract at least one audio feature from the at least one audio signal;
- classifying the at least one filtered audio signal based on the at least one audio feature to produce a classification of the at least one filtered audio signal, the classification including a reaction of the person to the media content being played by the media player; and
- based on the genre and the reaction, automatically modifying operation of the media player by modifying a playlist of media content played by the media player to include more songs of the genre.

18. A system comprising:
- at least one microphone configured to detect at least one audio signal present in a physical environment while a media player is playing a song having a genre, the at least one audio signal including first audio data corresponding to the song, second audio data associated with a person exposed to the song, and third audio data associated with noise in the physical environment different than the first audio data and the second audio data;
- at least one processor; and
- memory including instructions that, when executed by the at least one processor, cause the system to perform operations including:
  - cancelling the third audio data from the at least one audio signal to generate at least one filtered audio signal;
  - analyzing the at least one filtered audio signal to extract at least one audio feature from the at least one audio signal;
  - classifying the at least one filtered audio signal based on the at least one audio feature to produce a classification of the at least one filtered audio signal, the classification including a reaction of the person to the media content being played by the media player; and
  - based on the genre and the reaction, automatically modifying operation of the media player by modifying a playlist of media content played by the media player to include more songs of the genre.

* * * * *